(12) United States Patent
Shearer et al.

(10) Patent No.: US 12,053,934 B2
(45) Date of Patent: Aug. 6, 2024

(54) CONDUCTIVE FILM ADHESIVE

(71) Applicant: ORMET CIRCUITS, INC., San Diego, CA (US)

(72) Inventors: Catherine A. Shearer, San Marcos, CA (US); Peter A. Matturri, Del Mar, CA (US); Michael C. Matthews, Encinitas, CA (US)

(73) Assignee: Ormet Circuits, Inc., San Diego, CA (US)

( * ) Notice: Subject to any disclaimer, the term of this patent is extended or adjusted under 35 U.S.C. 154(b) by 660 days.

(21) Appl. No.: 16/791,134

(22) Filed: Feb. 14, 2020

(65) Prior Publication Data

US 2020/0180233 A1    Jun. 11, 2020

Related U.S. Application Data

(63) Continuation-in-part of application No. 13/843,555, filed on Mar. 15, 2013, now abandoned.

(Continued)

(51) Int. Cl.
*B29C 65/48*    (2006.01)
*B29C 65/50*    (2006.01)
(Continued)

(52) U.S. Cl.
CPC ...... *B29C 65/4855* (2013.01); *B29C 65/4835* (2013.01); *B29C 65/4875* (2013.01);
(Continued)

(58) Field of Classification Search
CPC ... H01L 2224/3201; H01L 2224/27003; H01L 24/83; H01L 24/29; B32B 37/1207;
(Continued)

(56) References Cited

U.S. PATENT DOCUMENTS 4,642,160 A    2/1987    Burgess
4,645,733 A    2/1987    Sullivan
(Continued)

FOREIGN PATENT DOCUMENTS

EP    0056930 A1    8/1982
JP    53-133799    11/1978
(Continued)

OTHER PUBLICATIONS

Fraunhofer IZM Information Sheet for "Temporary Wafer Bonding for Wafer Thinning and Thin Wafer Back Side Processing" (available at https://www.izm.fraunhofer.de/content/dam/izm/de/documents/Abteilungen/ASSID_All_Silicon_System_Integration_Dresden/information%20sheet_Thin%20Wafer%20Handling%202011-11.pdf); Sep. 15, 2017.

(Continued)

*Primary Examiner* — Vishal I Patel
(74) *Attorney, Agent, or Firm* — Daniel Roth

(57) ABSTRACT

An inventive composition and process for formation of a conductive bonding film are disclosed. The invention combines adhesive bonding sheet technologies (e.g. die attach films, or DAFs) with the electrical and thermal conductivity performance of transient liquid phase sintered paste compositions. The invention films are characterized by high bulk thermal and electrical conductivity within the film as well as low and stable thermal and electrical resistance at the interfaces between the inventive film and metallized adherends.

18 Claims, 1 Drawing Sheet

Related U.S. Application Data

(60) Provisional application No. 61/661,258, filed on Jun. 18, 2012.

(51) Int. Cl.
*B32B 37/12* (2006.01)
*H01L 23/00* (2006.01)

(52) U.S. Cl.
CPC ........ *B29C 65/489* (2013.01); *B29C 65/5057* (2013.01); *B32B 37/1207* (2013.01); *H01L 24/29* (2013.01); *H01L 24/83* (2013.01); *H01L 2224/27003* (2013.01); *H01L 2224/3201* (2013.01)

(58) Field of Classification Search
CPC .............. B29C 65/5057; B29C 65/489; B29C 65/4875; B29C 65/4835; B29C 65/4855
See application file for complete search history.

(56) References Cited

U.S. PATENT DOCUMENTS

| | | |
|---|---|---|
| 4,802,951 A | 2/1989 | Clark |
| 4,897,338 A | 1/1990 | Spicciati |
| 4,921,777 A | 5/1990 | Fraenkel |
| 5,043,102 A | 8/1991 | Chen |
| 5,088,189 A | 2/1992 | Brown |
| 5,356,403 A | 10/1994 | Faulks |
| 5,463,190 A | 10/1995 | Carson |
| 5,565,267 A | 10/1996 | Capote |
| 5,639,556 A | 6/1997 | Gaumet |
| 5,716,663 A | 2/1998 | Capote |
| 5,830,389 A | 11/1998 | Capote |
| 5,853,622 A | 12/1998 | Gallagher |
| 5,922,397 A | 7/1999 | Brandt |
| 5,948,533 A | 9/1999 | Gallagher |
| 5,980,785 A | 11/1999 | Xi |
| 6,054,761 A | 4/2000 | Mccormack |
| 6,068,782 A | 5/2000 | Brandt |
| 6,085,415 A | 7/2000 | Gandhi |
| 6,114,413 A | 9/2000 | Kang |
| 6,127,619 A | 10/2000 | Xi |
| 6,132,646 A | 10/2000 | Zhou |
| 6,139,777 A | 10/2000 | Omoya |
| 6,143,116 A | 11/2000 | Hayashi |
| 6,207,259 B1 | 3/2001 | Iino |
| 6,281,448 B1 | 8/2001 | Tsukamoto |
| 6,297,559 B1 | 10/2001 | Call |
| 6,337,522 B1 | 1/2002 | Kang |
| 6,370,013 B1 | 4/2002 | Iino |
| 6,481,415 B1 | 11/2002 | Cook |
| 6,673,190 B2 | 1/2004 | Haas |
| 6,716,036 B2 | 4/2004 | Gandhi |
| 6,896,172 B2 | 5/2005 | Taguchi |
| 7,022,266 B1 | 4/2006 | Craig |
| 7,169,209 B2 | 1/2007 | Nakata |
| 7,214,419 B2 | 5/2007 | Umeda |
| 8,221,518 B2 | 7/2012 | Shearer |
| 2001/0044590 A1 | 11/2001 | Ceriani |
| 2002/0051728 A1 | 5/2002 | Sato |
| 2002/0071157 A1 | 6/2002 | Sauze |
| 2003/0234074 A1 | 12/2003 | Bhagwagar |
| 2004/0217152 A1 | 11/2004 | Taguchi |
| 2004/0265608 A1 | 12/2004 | Pecorini |
| 2008/0023665 A1 | 1/2008 | Weiser |
| 2008/0207814 A1 | 8/2008 | Wrosch |
| 2008/0261038 A1 | 10/2008 | Yamamoto |
| 2009/0155608 A1 | 6/2009 | Nomura |
| 2010/0230145 A1 | 9/2010 | Holcomb |
| 2010/0252616 A1* | 10/2010 | Shearer .................. H05K 3/321 228/248.1 |
| 2011/0171372 A1 | 7/2011 | Shearer |
| 2012/0261174 A1* | 10/2012 | Chuma ................ H05K 3/3478 428/323 |
| 2014/0042212 A1 | 2/2014 | Shearer |

FOREIGN PATENT DOCUMENTS

| | | |
|---|---|---|
| JP | 10190159 | 7/1998 |
| JP | 2001326458 A | 11/2001 |
| JP | 2002261105 A | 9/2002 |
| JP | 4044349 B2 | 11/2007 |
| JP | 2008038111 A | 2/2008 |
| JP | 4493929 B2 | 4/2010 |
| JP | 2010116453 A | 5/2010 |
| JP | 4537555 B2 | 6/2010 |
| JP | 4642173 B2 | 12/2010 |
| JP | 3187373 U | 10/2013 |
| KR | 1020050083640 | 8/2005 |
| WO | 1998039105 | 9/1998 |
| WO | 1999065086 | 12/1999 |
| WO | 2000059645 A1 | 10/2000 |
| WO | 2004026517 A3 | 5/2004 |
| WO | 2010114874 A2 | 10/2010 |
| WO | 2010114874 A3 | 3/2011 |
| WO | 2011078918 A2 | 6/2011 |
| WO | WO-2011077679 A1 * | 6/2011 .............. C08L 63/00 |
| WO | 2011078918 A3 | 10/2011 |

OTHER PUBLICATIONS

Henkel Product Information Sheet for "Conductive Die Attach Films (CDAF)" (available at http://www.henkel-adhesives.com/conductive-die-attach-films-46383.htm); Sep. 15, 2017.
JP2002-261105A, Sep. 13, 2002, English Translation of Abstract.
JP10-190159, Jul. 21, 1998, English Translation of Abstract.
JP53-133799A2, Nov. 21, 1978, Delphion_INPADOC Record.

* cited by examiner

CONDUCTIVE FILM ADHESIVE

RELATED APPLICATIONS

This application is a continuation-in-part of U.S. patent application Ser. No. 13/843,555 filed Mar. 15, 2013, which claims the benefit of priority under 35 USC § 119 of U.S. Provisional Application Ser. No. 61/661,258 filed Jun. 18, 2012, the entire disclosures of which are incorporated by reference herein in their entireties.

FIELD OF THE INVENTION

The invention disclosed relates to the field of adhesive joining metallized adherends with a bonding film. Further, the field of the invention relates to adhesive joining applications which require thermal transfer, and, in some cases, electrical transfer between adherends. Exemplary applications for the instant invention include attachment of semiconductor die to leadframes, lids and heatsinks to semiconductor packages, heat sinks to printed circuit boards, bonding of solar cells to backside collection grids, and other applications in which thermal and/or electrical conduction between adherends is desired.

BACKGROUND OF THE INVENTION

Bonding films are well known as a convenient means to form temporary or permanent mechanical bonds between two adherends. Examples of such a bonding film is Nippon Steel Chemical nonconductive DAF product numbers NEX-130C, NEX-130CT, NEX-130E4X, NEX-130FX described in Japanese patent numbers: P4044349, P4493929, P4537555, P4642173, P2008-38111A, and P2010-116453A, which are incorporated in their entirety by reference herein. When thermal conduction between adherends is required, a thermally conductive filler is generally incorporated into the bonding film. In such a thermally conductive film, thermal, and, if required, electrical conduction occurs by particle-to-particle contact both within the bulk of the film as well as at the interfaces with the adherends. For electrical conduction, particle-to-particle, and particle-to-adherend contact may provide sufficient conductivity; however, thermal conductivity, which is a function of contact area, is often insufficient. In addition, electrical and thermal conductivity reliant on particle-to-particle and particle-to-adherend contact is vulnerable to degradation and full disruption due to adverse environmental conditions.

In many applications requiring particularly high thermal conductivity (e.g. the attachment of a power die to a lead frame) the die surface is metallized and bonding is achieved by soldering the metallized die to the metal lead-frame to provide a continuous, metallurgically bonded pathway that spans the entire area of the adhesive interface. The problems with using solder for such an application are that it remelts during subsequent electronic assembly operations, the solder bond often contains voids, the solder bonding process is relatively slow, and the solder bond exerts considerable thermal expansion mismatch strain on the die.

Transient liquid phase sintered (TLPS) paste compositions such as those described in U.S. Pat. No. 5,376,403, incorporated in its entirety by reference herein, have been used to create electrically and thermally conductive pathways between metallized elements within electronic structures. Like solder joining, TLPS pastes form continuous metallurgically alloyed connections from one metallized adherend, through the bulk of the processed TLPS paste and to the opposing metallized adherend. When processed, the continuous metallic mesh formed from the metal particles in the TLPS paste is entwined with a polymer matrix. The advantage of the TLPS pastes over solder is that they do not remelt during subsequent electronic assembly cycles. One detriment to TLPS pastes for bonding operations is that the pastes tend to form voids when disposed between relatively large adherends. In addition, there is typically more yield loss associated with paste dispensing than with film application and the application of film can be held to tighter tolerances for higher component density in electronic assemblies. Overall, paste is less convenient to handle than film and is more conducive to assembly defects.

Thus, there is a continuing need for improved film-based conductive adhesives with high electrical and thermal conductivity that is stable in adverse environmental conditions, does not mechanically stress the die, and maintains a tightly controlled application footprint.

SUMMARY OF THE INVENTION

The present invention provides non-turbid, stable film-casting varnishes that yield conductive films with the following attributes:
1. High thermal and electrical conductivity that extends through a continuous metallic network from adherand to adherand after the bonding operation.
2. High mechanical strength at solder reflow temperatures after the bonding operation.
3. Long room-temperature shelf life.
4. Bond processing conditions characteristic of passively-loaded thermally conductive films.
5. Tack and flexibility characteristics typical of passively-loaded thermally conductive films.

The present invention also provides conductive film adhesives that include:
1. a film-forming polymer;
2. a flux; and
3. a filler that includes a mixture of metallic particles capable of undergoing transient liquid phase sintering at a bonding temperature (T1).

Optionally, the film may also include one or more of the following constituents:
4. a means to inert the flux residues subsequent to processing;
5. one or more thermosetting resins; and
6. one or more catalysts or curing agents.

In certain aspects, the mixture of particles includes at least one reactive metallic element R1 and at least one reactive metallic element R2, where R1 and R2 are capable of undergoing transient liquid phase sintering at temperature T1. In certain embodiments, T1 is less than 250° C.

R1 is typically a high melting point (HMP) metal, and can include one or more reactive metallic element selected from the group consisting of copper, silver, gold, platinum, indium, aluminum, nickel and gallium. In certain embodiments, R1 is copper, silver or combinations thereof.

R2 is typically a low melting point (LMP) metal, and can include one or more reactive metallic element selected from the group consisting of Sn, Bi, Pb, Cd, Zn, Ga, In, Te, Hg, Tl, Sb, Se, and Po. In certain aspects, R2 is Sn, and is alloyed with at least one element selected from the group consisting of Bi, Cu, Ag, Sb or In.

In certain embodiments, the polymer has a weight-average molecular weight of 1,000-200,000 Da, typically 5,000 to 100,000 Da, often 10,000 to 75,000 Da. The polymer may comprise 10-50 weight percent of the conductive film adhesive, without filler. The polymer can be, for example, phenoxy resin.

In certain embodiments, the thermosetting resin is an epoxy resin. In various aspects of the invention, the catalyst or curing agent is selected from the group consisting of dicyandiamide, imidazoles, imidazole derivatives, anhydrides, carboxylic acids, amides, imides, amines, alcohols, phenols, aldehydes, ketones, nitro compounds, nitriles, carbamates, isocyanates, amino acids, peptides, thiols, sulfonamides, semicarbazones, oximes, hydrazones, cyanohydrins, ureas, phosphoric esters/acids, thiophosphoric esters/acids, phosphonic esters/acids, phosphites, novolacs (both phenolic and cresolic), phosphines and phosphonamides, and may comprise 1-25 parts per hundred parts of said thermosetting resin.

In certain embodiments, the mixture of metallic particles comprises 75-98% by weight of the conductive film adhesive. The particles can be, for example, substantially spherical, and/or can typically be less than 30 micron in diameter. Optionally, the metallic particles can be protected by an organic or inorganic coating.

In certain embodiments, the flux is selected from molecules bearing one or more carboxylic acid groups, amino acids and/or polyols. The flux can include one or more carboxylic acid having a molecular weight less than 300 Da, and may include one or more carboxylic acid, and may have at least two carboxylic acid functional groups. The composition may further include at least one tertiary amine, and in certain embodiments, the carboxylic acid and the tertiary amine are combined to form a buffering mixture or salt. Such tertiary amine can be, for example, alkanolamine. The carboxylic can be, for example, oxalic acid, malonic acid, succinic acid, glutaric acid, fumaric acid, maleic acid or a combination thereof. In certain aspects, the ratio of the flux to the thermosetting resin is 0.1 to 1.0 by weight.

In addition to the aforementioned components, a solvent or other liquid medium may be incorporated into the base material, or varnish, used to form the films of the invention such that the varnish can be coated onto a carrier material by printing, curtain coating, doctor blading, extruding and the like.

Once deposited onto a carrier material, such as a polyethylene terephthalate (PET) film, the solvent or other liquid medium may be removed by heated drying or other means to form a sheet of conductive film adhesive on the carrier.

In some instances, the heavy metallic fillers may settle and segregate to the bottom of the conductive film adhesive during the film formation process. In such instances, it may be advantageous to laminate two films together using a lamination press, roll laminator or the like in order to form a dual-thickness film with a more homogeneous metal filler distribution.

Once formed on the carrier, the conductive film adhesive may be transferred, bonded or laminated onto one adherend (e.g. a semiconductor wafer). The exact sequence of steps in which the carrier is removed from the conductive film adhesive is predicated by the specific requirements of the application, as will be well known to the skilled artisan. In particular embodiments, although the conductive film adhesive is separable from the carrier, the conductive film adhesive is able to form a substantially permanent bond between adherends.

BRIEF DESCRIPTION OF THE DRAWINGS

FIG. 1A shows application of a carrier backed conductive film to a first adherand. FIG. 1B shows removal of the carrier from the assembly of FIG. 1A. FIG. 1C shows contacting a second adherand with the exposed, surface of the film in FIG. 1B. FIG. 1D shows the thermally processed assembly containing the two adherands interconnected with a layer of intermetallic species disposed within a polymer matrix.

DETAILED DESCRIPTION OF THE INVENTION

Figure 1A:
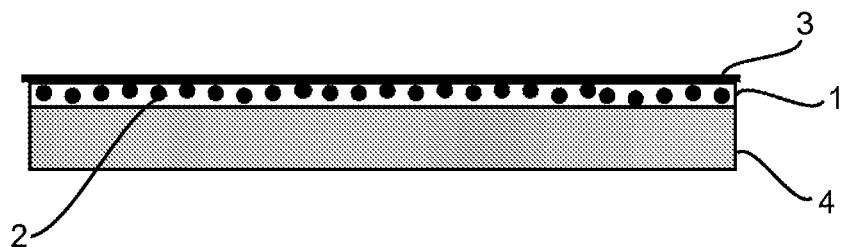
FIGS. 1A-D illustrate application of the film adhesives according to one embodiment of the invention.

It is to be understood that both the foregoing general description and the following detailed description are exemplary and explanatory only and are not restrictive of the invention claimed. As used herein, the use of the singular includes the plural unless specifically stated otherwise.

As used herein, "or" means "and/or" unless stated otherwise. Furthermore, use of the term "including" as well as other forms, such as "includes," and "included," is understood as "comprising" and is not limiting. The section headings used herein are for organizational purposes only and are not to be construed as limiting the subject matter described.

Whenever it appears herein, a numerical range of integer value such as "1 to 20" refers to each integer in the given range; e.g., "1 to 20 percent" means that the percentage can be 1%, 2%, 3%, etc., up to and including 20%. Where a range described herein includes decimal values, such as "1.2% to 10.5%", the range refers to each decimal value of the smallest increment indicated in the given range; e.g. "1.2% to 10.5%" means that the percentage can be 1.2%, 1.3%, 1.4%, 1.5%, etc. up to and including 10.5%; while "1.20% to 10.50%" means that the percentage can be 1.20%, 1.21%, 1.22%, 1.23%, etc. up to and including 10.50%.

Terms, Definitions, and Abbreviations

The term "about" as used herein means that a number referred to as "about" comprises the recited number plus or minus 1-10% of that recited number. For example, "about" 100 degrees can mean 95-105 degrees or as few as 99-101 degrees depending on the situation.

The term "alloy" refers to a mixture containing two or more metals, and optionally additional non-metals, where the elements of the alloy are fused together or dissolving into each other when molten.

"Flux" as used herein, refers to a substance, often an acid or base, that promotes fusing of metals and in particular, removes and prevents the formation of metal oxides.

The terms "melting temperature" or "melting point," as used herein, refer to the temperature (a point) at which a solid becomes a liquid at atmospheric pressure.

The terms "high melting temperature metal", "high melting point metal" or "HMP metal" as used herein, refers to a metal having the melting temperature that is equal to, or higher than, about 400° C.

The terms "low melting temperature metal", "low melting point metal" or "LMP metal" as used herein, refers to a metal having the melting temperature that is lower than about 400° C.

The term "sintering" refers to a process in which adjacent surfaces of metal powder particles are bonded by heating. "Liquid phase sintering" refers to a form of sintering in which the solid powder particles coexist with a liquid phase. Densification and homogenization of the mixture occur as the metals diffuse into one another and form new alloy and/or intermetallic species.

The term "transient liquid phase sintering" or "TLPS," with the reference to powders, describes a process in which the liquid only exists for a short period of time as a result of the homogenization of the metals to form a mixture of solid alloy and/or intermetallic species. The liquid phase has a very high solubility in the surrounding solid phase, thus diffusing rapidly into the solid and eventually solidifying. Diffusional homogenization creates the final composition without the need to heat the mixture above its equilibrium melting temperature.

The term "processing temperature" or "$T_1$" refers to a temperature at which a reactive metal and a HMP metal (both of which are described and discussed in detail below in the application) form intermetallic species.

The terms "intermetallics" or "intermetallic species" refer to a solid material, which is comprised of two or more metal atoms in a certain proportion, that has a definite structure which differs from those of its constituent metals.

The term "substantially permanently bonded" as used herein with respect to the bond between the conductive film adhesive and one or more adherends, indicates that the bond between the conductive film adhesive and the adherends is intended to be permanent, such that the bond between the adherends cannot be easily broken (e.g., cannot be broken without causing damage to one or more of the adherends).

The present invention is based on the concept of combining TLPS paste technology with conductive film technology to provide electrically and thermally conductive film-based adhesives. Such combinations, however, present a significant number of technical challenges. With conventional thermally conductive film adhesives, the fillers are generally introduced in flake form to maximize the number of contacts between thermally conductive particles. In TLPS compositions, however, the filler is a reactive metallic powder, and the preferred morphology is spherical. A spherical morphology minimizes the amount of surface area that must be cleaned by the flux prior to the sintering operation inherent in TLPS. This reduction in surface area causes a concomitant reduction in contact points between particles for a given weight percentage of filler loading. In order for the TLPS sintering reaction to occur and thereby form a thermally and electrically conductive pathway spanning an adhesive joint, the particles must be in contact with one another and with the adherands. Therefore, the overall weight percentage loading of the reactive metal fillers in TLPS compositions, as well as the relative proportions of the metallic fillers and their particle size distributions, must be carefully considered and controlled.

Likewise, the selection of an appropriate flux for the reactive metal particles is complicated by the film format of the application. In order to efficiently flux a multitude of small reactive metal particles, the flux molecules must be small and have high functionality. The chemical mechanism of the fluxing reaction must not generate volatile components that might be entrapped in a thin laminar bondline of the film, nor can it generate corrosive species that would be permanently entrapped in the bondline. Small polar molecular species that might otherwise be appropriate flux agents, do not have good miscibility with the high molecular weight, moisture repelling polymers that are typically used to form a flexible film base. Further, the time between bonding the film to the semiconductor wafer and subsequent singulation and attachment of a film-bearing die to a substrate may be as long as several months. During this shelf life period, the flux molecules must not segregate from the film polymer, must maintain efficacy and must not cause unwanted reactions.

Furthermore, TLPS metallurgy places special additional constraints on film-forming polymers used as the base in film adhesives. The film-forming polymer must not have functional groups that would cause it to react with the flux molecules. It must be hydrophobic, but still miscible with the flux chemistry. It must maintain the spherical particles in a homogeneous distribution, but not physically interfere with the contact and reaction of the metal particles. The viscosity of the film-forming polymer must drop substantially at the bonding and TLPS sintering temperature so as not to impede the interaction between metal particles, without dropping so much that bleed and segregation issues result.

Therefore, in order to create a successful hybrid between TLPS and conductive film technology, the selection of appropriate reactive metal particles, fluxing agents and compatible film-forming polymers is critical.

The present invention is based on the observation that formulations of carefully selected components can give rise to a successful film-based conductive adhesive employing TLPS technology.

The invention thus provides conductive film adhesives that offers superior electrical and thermal conductivity as well as superior ease of handling and use when compared to conventional film alternatives. The invention conductive film adhesives achieve these superior properties by combining selected film adhesive technology with the high electrical and thermal conductivity of transient liquid phase sintered pastes.

In certain embodiments, the invention provides conductive film adhesives that include:
1) a polymer,
2) a flux,
3) a filler that includes a mixture of metallic particles that includes at least one reactive metallic element R1 and at least one reactive metallic element R2, where R1 and R2 are capable of undergoing transient liquid phase sintering at temperature T1,
4) optionally, one or more thermosetting resins, and
5) optionally, one or more curing agents or catalysts.

In certain embodiments, the invention conductive film adhesive is manufactured by first formulating a varnish that can be cast on a carrier substrate. Casting of the varnish may be accomplished by any method known in the art, including but not limited to, screen printing, stencil printing, doctor blading, curtain coating, spraying, and extruding. The varnish typically incorporates a fugitive solvent to facilitate the casting operation. Once the varnish has been cast on the carrier substrate, the solvent can be removed by drying. The conductive film adhesive thus created is then ready for use. Alternatively, the conductive film adhesive may undergo further processing to render it suitable for specific applications. For example, in certain embodiments of the invention, one layer of conductive film adhesive is inverted over another and laminated together to form a single film with a more homogeneous distribution of metallic particles. Multiple layers of film can be laminated to provide thick films with homogenously distributed conductive.

Figure 1B:
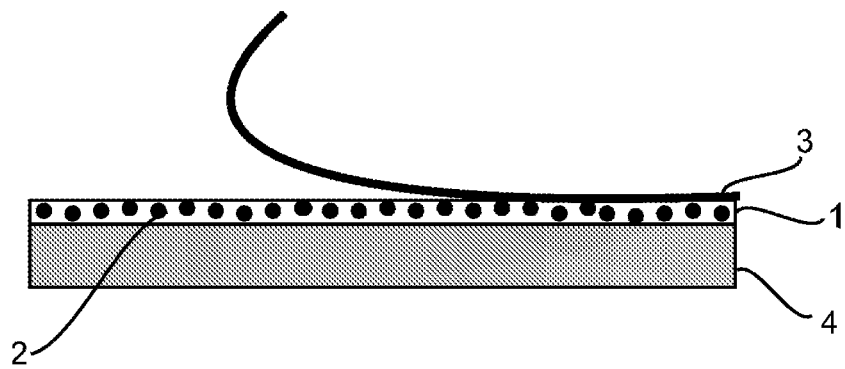
Figure 1C:
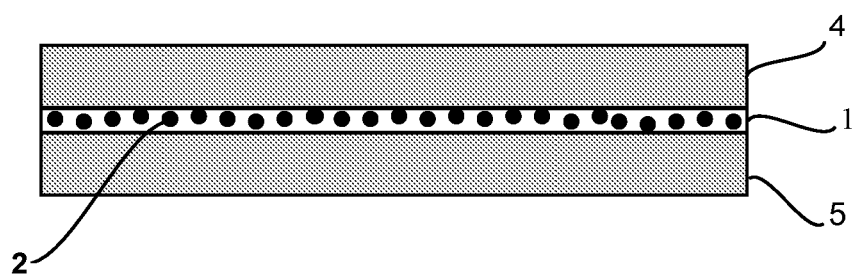
Figure 1D:
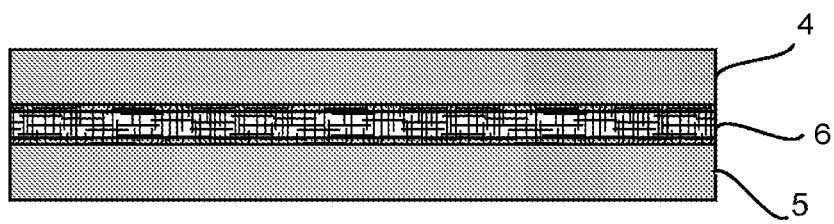

In one embodiment of the invention, a conductive film adhesive 1 containing metallic particles 2 on a carrier substrate 3 is contacted with a first metallized adherend 4. (FIG. 1A) The carrier substrate 3 is removed (FIG. 1B), and a second metallized adherend 5 is contacted with the opposing surface of the conductive film adhesive (FIG. 1C). The structure thus created—adherend*conductive film adhesive*adherend—is then subjected to a thermal processing regime with a peak processing temperature T1. At or below the peak temperature T1, the thermosetting resin, if present, becomes hardened by the curing agent, catalyst and/or the flux. Also at or below peak temperature T1, the flux cleans the metallic particles comprising reactive metal element R1. Further, reactive metal element R2 undergoes transient liquid phase sintering with reactive metal element R1, as well as the metallization on the adherends to form a layer of intermetallic species 6 at or below T1, which interconnects the adherends (FIG. 1D). Due to mismatches in thermal expansion of the adherends, which are likely to exist, it is beneficial to effect transient liquid phase sintering at a low temperature. Typically, T1 is less than 250° C.; frequently less than 220° C.; often less than 200° C.; and can be 180° C. or less.

It will be understood by those of skill in the art that there are a wide variety of potential processing schemes for applying and thermally processing the invention conductive film adhesives to form electrically and thermally conductive adhesive joints between adherends. Metallized adherends that are solder-wettable are advantageous due to the superior conductive pathway created when reactive metallic element R2 reacts with the metallization on the adherends to form intermetallic species.

Polymer Component

The polymer provides ease of use and handling of the film form of the conductive adhesives of the invention. The polymer may be any that is useful for creating a conductive film adhesive that can be easily handled and that is compatible with the remainder of the conductive film adhesive composition. The polymer can be any thermoplastic or thermoset that can withstand exposure to thermal processing at T1. Examples of suitable polymers include, but are not limited to: phenoxies, acrylics, rubbers (butyl, nitrile, etc.), polyamides, polyacrylates, polyethers, polysulfones, polyethylenes, polypropylenes, polysiloxanes, polyvinyl acetates/polyvinyl esters, polyolefins, cyanoacrylates, polystyrenes, and the like.

Polymers with a weight-average molecular weight in the range of 10,000-75,000 Da are particularly suitable for both handling and incorporation into the varnish. Polymers a weight-average molecular weight in excess of 75,000 Da have been found to interfere with the TLPS reaction of metallic particles during processing. See EXAMPLE 7, below.

In certain aspects, the polymer is a phenoxy resin, such as Phenoxy YP-50S (Nippon Steel Chemical Corporation). In certain embodiments, the level of incorporation of the polymer is between 10 and 50 weight percent of the conductive film adhesive exclusive of the metallic filler.

Metallic Particles

The mixture of metallic particles in the invention conductive film adhesives undergo transient liquid phase sintering during thermal processing to create superior electrical and thermal conduction pathways. Sintering is a process whereby adjacent surfaces of metal powder particles are bonded by heating. Liquid phase sintering is a special form of sintering in which solid powder particles coexist with a liquid phase. Densification and homogenization of the mixture occur as the metals diffuse into one another and form new alloy and/or intermetallic species.

In transient liquid phase sintering (TLPS) of particles, the liquid only exists for a short period of time as a result of the homogenization of the metals to form a mixture of solid alloy and/or intermetallic species. The liquid phase has a very high solubility in the surrounding solid phase, thus diffusing rapidly into the solid and eventually solidifying. Diffusional homogenization creates the final composition without the need to heat the mixture above its equilibrium melting temperature.

Reactive metallic element R2 (e.g. Sn) and reactive metallic element R1 (e.g. Cu or Ag) contained within the mixture of metallic particles, undergo transient liquid phase sintering at T1 to form new alloy compositions and/or intermetallics. The diffusion and reaction of the reactive element(s) R2 and R1 continues until the reactants are fully depleted, there is no longer a molten phase at the process temperature, or the reaction is quenched by cooling the mixture. After cooling, subsequent temperature excursions, even beyond the original melt temperature, do not reproduce the original melt signature of the mixture. See, e.g., U.S. Pat. No. 8,221,518, the entire contents of which is incorporated by reference herein. This is the signature of a typical low temperature transient liquid phase sintered metal mixture. The number and nature of the new alloy and/or intermetallic species formed is dependent on the selection of metallic constituents, their relative proportions, the particle size distribution and the process temperature. The composition of the residual components of the original reactive metal R2 and alloys thereof, is likewise dependent on these factors.

The microstructure of processed TLPS compositions appears as a network of particles of high melting temperature metal bearing one or more "shells" of the newly formed alloy/intermetallic compositions, which are interconnected by the non-reactive portion of the original low melting temperature alloy. Open areas of the network structure are generally filled with the cured polymeric binder.

Reactive metal R1 is typically copper, a noble metal or mixtures thereof, although some alternatives may be useful in specific applications. Copper is relatively inexpensive, plentiful, compatible with the metallurgy typically used for circuit elements, possesses a melting temperature in excess of 1000° C., is ductile, is readily available in a variety of powder forms, and is an excellent electrical and thermal conductor. Silver, gold, platinum, indium, aluminum, nickel and gallium are also specifically contemplated for use in the invention compositions, such as in applications in which copper particles would be vulnerable to subsequent manufacturing processes (e.g. copper etching), or in cases in which the use of a noble metal would substantially increase the net metal loading by reducing the need for flux. In some applications, palladium, beryllium, rhodium, cobalt, iron, and molybdenum are contemplated for use in the compositions of the invention.

The metallic particles containing R2 may be any combination of one or more elements or alloys of Sn, Bi, Pb, Cd, Zn, Ga, In, Te, Hg, Tl, Sb, Se, Po, or another metal or alloy having a constituent element that is reactive with the metallic element R1. In certain aspects of the invention, R2 is contained in a blend of different types of particles. For example, the particles can different sizes and/or contain different alloys of R2. The principal requirement of the blend of particles containing R2 is that some portion of it becomes molten at the process temperature to render the full complement of reactive species within the alloy blend available for reaction with the reactive metal R1 prior to vitrification of any polymers in the composition. Alloys of Sn, particularly with Bi, are particularly suitable for use in the invention films. Alloys of Sn with Cu, Ag, Sb or In are also contemplated.

The use of additional reactive metal(s) in combination with the at least one R1 is also contemplated in order to obtain TLPS reaction products with optimal characteristics (e.g., conductivity, stability, compatibility with adherands). Optional metal additives can be added as separate particles, as coatings on the reactive metal R1, or on one of the particles containing reactive metal R2 or alloys thereof; or pre-alloyed with R1, R2 or alloys of either reactive metal. The particulate additives will typically be in the size range of nanoparticles to 20 μm. The metal additive can be, for example, any metal chosen from the group consisting of boron, aluminum, chromium, iron, nickel, zinc, gallium, silver, palladium, platinum, gold, indium, antimony, bismuth, tellurium, manganese, phosphorous and cobalt.

In the conductive compositions described herein, the TLPS reaction allows the reactive metal R1 and the reactive metal R2 and alloys thereof, to form a metallurgically connected matrix. Without wishing to be bound by a particular theory, it is believed that the additive metals alter the grain structure, extent of interdiffusion, and rate of formation of the matrix formed between R1 and R2 during processing of TLPS compositions. It is further believed these structural alterations provide a wide variety of benefits to the composition for specific applications, such as promoting greater flexibility and the like.

The metallic particles comprising reactive metallic elements R1 and R2 may be introduced into invention conductive film adhesive compositions in a wide variety of forms. The particles may be of a single metallic element or alloys of two or more elements. The particles may be spherical, non- or near-spherical, dendritic, flake, platelet, spongiform or similar shapes, or combinations thereof. The particles may have one metallic element coated onto another, or the metallic element may be present as a coating on a non-metallic particle core. Dopants (e.g. boron) may be added to the metallic particles to retard oxidation. Organic coatings (e.g. saturated or unsaturated fatty acids) may be applied to the metallic particles to retard oxidation or facilitate incorporation into the varnish. In certain embodiments, spherical metallic particles in the size range of 1-30 micron in diameter are used. Typical mixtures include metallic particles substantially comprising Cu or Ag, and metallic particles substantially comprising alloys of Sn. An organic coating on the particles may be advantageous for the Cu or Ag particles. The ratio of the substantially Cu or Ag-containing particles to Sn alloy particles is typically in the range of 0.3 to 4. The total weight percentage of metallic particles in invention conductive film adhesive is in the range of 75-98%.

Flux Component

The flux serves to clean the surfaces of the metallic particles in order to facilitate the TLPS reaction. Materials contemplated for use as fluxes include carboxylic acids, inorganic acids, alkanolamines, amino acids, polyols, phenols, rosin, chloride compounds and salts, halide compounds and salts, and the like. A key element of the invention compositions is that the flux is rendered inert at the conclusion of thermal processing of the adhesive joint. Typically, a thermosetting resin is incorporated to react with the functional groups of the flux to render it inert and immobile. Suitable flux materials for use in the invention compositions are alkanolamines, carboxylic acids, phenols, amino acids, polyols and mixtures thereof. In certain embodiments, the flux includes mixtures or salts of carboxylic acids and tertiary amines due to their synergistic flux activity and latency in the presence of the thermosetting resin.

Carboxylic Acids. Carboxylic acids appropriate for use in the present invention may be monomeric, oligomeric or polymeric in nature. The carboxylic acid species employed may have more than one functional group to promote efficient tie-in with the overall organic matrix and particularly the thermosetting resin. Multiple carboxylic acids may be blended together to create an optimum balance of flux activity and other characteristics, such as viscosity, miscibility with other system components, lubricity, reactivity with other organic components and the like. Both the acid strength and equivalent weight for each carboxylic acid function will determine the quantity necessary for a given surface area of reactive metal R1. In certain embodiments, the carboxylic acid is a diacid with a molecular weight less than 300 Da, or, typically less than 150 Da. Such diacids include oxalic acid, malonic acid, succinic acid, glutaric acid, fumaric acid, and maleic acid.

Tertiary Amines. When tertiary amines are used, they also serve as a flux for R1 and any metallic adherends. Tertiatry amines are advantageously employed in a mixture or salt form with the acid functionalities to prevent premature reaction with the other organic components due to the catalytic effect of the metals and metal oxides. The tertiary amine thus forms a buffering mixture or salt with acidic functionalities of the carboxylic acid. The buffering mixture or salt functions as a chemically protected species until the composition is thermally processed. The tertiary amine may be monomeric, oligomeric or polymeric and a combination of one or more molecules may be used to obtain optimum effect. Tertiary alkanolamines such as triethanolamine and N,N,N',N' tetrakis(2-hydroxyethyl) ethylenediamine are suitable for forming buffering mixtures or salts with the carboxylic acid functional groups.

In certain embodiments, the carboxylic acid-tertiary alkanolamine mixture or salt flux is 0.1-8% by weight in the invention conductive film adhesive. When the optional thermosetting resin is present, optimally, the ratio of the mixture or the salt flux to the thermosetting resin is 0.1-1.0 by weight.

Amino Acids and Polyols. In certain embodiments, an amino acid is used as a flux. Exemplary amino acids suitable for use as a flux include, but are not limited to, glycine, glutamic acid, and threonine. In certain embodiments, the amino acid flux is 0.1-8% by weight in the invention conductive film adhesive.

In certain embodiments, a polyol is used as flux. Polyols with less than 10 hydroxyl groups per molecule are particularly suitable. In certain embodiments, the polyol flux is tetraethylene glycol.

Thermosetting Resin Component

An optional thermosetting resin can added to invention compositions as a means to inert the flux and to improve the adhesion and high temperature performance of the polymeric portion of the invention conductive film adhesive. The thermosetting resin may be any resin that can react with and effectively immobilize carboxylic acid functional groups. Resins that meet this requirement include, but are not limited to, epoxies, phenolics, novalacs (both phenolic and cresolic), polyurethanes, polyimides, bismaleimides, maleimides, cyanate esters, polyvinyl alcohols, polyesters and polyureas. Other resins may be modified to be reactive with the carboxylic acid or phenol bearing moieties. Examples of such modified resins include acrylics, rubbers (butyl, nitrile, etc), polyamides, polyacrylates, polyethers, polysulfones, polyethylenes, polypropylenes, polysiloxanes, polyvinyl acetates/polyvinyl esters, polyolefins, cyanoacrylates and polystyrenes. Typically, any thermosetting resin will function in the compositions of the invention if the species can be modified to contain at least one of the following functional groups: anhydrides, carboxylic acids, amides, imides, amines, alcohols/phenols, aldehydes/ketones, nitro compounds, nitriles, carbamates, isocyanates, amino acids/peptides, thiols, sulfonamides, semicarbazones, oximes, hydrazones, cyanohydrins, ureas, phosphoric esters/acids, thiophosphoric esters/acids, phosphonic esters/acids, phosphites, phosphonamides, sulfonic esters/acids or other functional groups known to one skilled in the art to act as reactive sites for polymerization. For example, a polyolefin would not be suitable as a resin in this invention, because it has no reactive sites for binding and has poor adhesive properties; however, an epoxy terminated polyolefin functions well when matched with the acidic groups of the flux-curing agents. In certain embodiments, the level of incorporation of thermosetting resin is 1-10% by weight of the conductive film adhesive.

Curing Agents and Catalysts

An optional curing agent or catalyst can be added to the varnish formulation to achieve superior adhesion or higher temperature performance for the cured polymer system. Curing agents (aka hardeners) or catalysts (aka accelerators) contemplated for use in the conductive film adhesives include dicyandiamide, imidazoles, anhydrides, carboxylic acids, amides, imides, amines, alcohols/phenols, aldehydes/ketones, nitro compounds, nitriles, carbamates, isocyanates, amino acids/peptides, thiols, sulfonamides, semicarbazones, oximes, hydrazones, cyanohydrins, ureas, phosphoric esters/acids, thiophosphoric esters/acids, phosphonic esters/acids, phosphites, novolacs (both phenolic and cresolic), phosphines, phosphonamides, or other agents known to those skilled in the art. Any curing agent or catalyst capable of cross-linking the thermosetting resin is suitable for use in the present invention. In some embodiments, imidazoles are used as a catalyst for the invention compositions. In other embodiments of the invention, amino acids are suitable curing agents for the invention compositions. In yet other embodiments of the invention compositions, carboxylic acids are suitable curing agents. The optimum level of incorporation for the curing agent or catalyst is particular to the curing agent or catalyst selected. For the imidazole catalyst, the optimum level of incorporation is in the range of 1-25 parts per hundred parts of the thermosetting resin, whereas for the amino acids and carboxylic acids the optimum level of incorporation is 10-100 parts per hundred of the thermosetting resin.

Methods for Using Conductive Films and Assemblies

The present invention also provides methods for adhesively attaching a first adherand to a second adherand. Such methods can be performed, for example, by a) contacting a first surface of a conductive adhesive film of the invention to a surface of the first adherand; b) contacting a second surface of a conductive adhesive film to a surface of a second adherand to form an assembly, where the first and second surfaces of the conductive adhesive film are opposed to each other, c) thermally processing the assembly to form a network comprising intermetallic and metal alloy between the first and second adherands, thereby of adhesively attaching a first adherand to a second adherand.

In certain aspects of the invention the first and second adherands are electronic articles such as semiconductor dies, lead frames, substrates, CPU's, microprocessors, flip chips, package lids, optical components (e.g., laser diodes, multiplexers and transceivers); sensors, power supplies, high speed mass storage drives, motor controls, high voltage transformers, automotive mechatronics and the like.

Also provided by the invention are assemblies comprising two adherands adhesively attached to each other through a cured and sintered layer of the conductive adhesive film of the invention. Specifically, the cured and sintered layer includes a network comprising at least one intermetallic, at least one metal alloy and at least one polymer.

EXAMPLES

The invention may be better understood by reference to the following, non-limiting, examples.

Example 1. TLPS Films Containing 41% Copper/50% Tin Bismuth Alloy

A varnish was prepared by combing the following components in the amounts indicated below in Table 1 with cyclopentanone solvent in a jar and mixing by hand with a metal spatula.

TABLE 1

Composition of 41% Copper/SO % SnBi Alloy Varnish

| Component type | Specific Component | Weight % |
|---|---|---|
| Flux (carboxylic acid + tertiary amine) | Glutaric acid | 0.16 |
| | N,N,N',N' tetrakis(2-hydroxyethyl) ethylenediamine | 0.84 |
| Thermosetting resin (1) | Epoxy HP-7200L (DIC Corporation) | 3.35 |
| Thermosetting resin (2) | Epoxy jER828EL (Mitsubishi Chemical Corporation) | 1.75 |
| Curing agent | Imidazole 2PHZ-PW (Shikoku Chemicals Corporation) | 0.20 |
| Polymer | Phenoxy YP-50S (Nippon Steel Chemical Corporation) | 2.7 |
| Metal filler (1) (<25 micron) | Cu (elemental) spherical | 41.0 |
| Metal filler (2) (<25 micron) | SnBi (80:20 wt. %) spherical | 50.0 |
| | Total | 100 |

The varnish mixture then underwent a second mixing using a high shear disperser to help the solid blend components with the liquid components. After the high shear dispersing mix, the varnish mixture was de-aerated. The dearated varnish mixture was then doctor-bladed onto a PET liner using a squeegee at about 50 μm thickness to create a wet film strip. The wet film strip was then dried in a convection oven at 100° C. for 10 minutes to remove the organic solvent and form a solid film strip about 35 micron thickness on a PET liner. The dried film on PET liner was then applied to the backside of a silicon wafer using a vacuum tack machine at a temperature of 100° C. The PET liner was then removed from the film strip and a layer of dicing tape was then applied directly to the film strip. The subsequent wafer-film strip-dicing tape assembly was then diced using a wafer saw. Singulated die were then removed from the dicing tape and attached to a copper leadframe using heat and pressure for a specified period of time. The film was then sintered to create the thermally and electrically conductive joint between the die and leadframe by ramping from room temperature to 200 C and then holding at 200 C for one hour. The die shear strength of the copper leadframe-film strip-silicon die assembly at 260° C. die shear temperature was 0.4 kg/mm2. The volume resistivity of the film strip was <500 μOhm-cm, and the thermal conductivity of the film strip was 25 W/mK.

Example 2. TLPS Films Containing 60% Copper/31% Tin Bismuth Alloy

A varnish was prepared by combing the following components in the amounts indicated below in Table 2 with cyclopentanone solvent in ajar and mixing by hand with a metal spatula.

TABLE 2

Composition of 60% Copper/31% SnBi Alloy Varnish

| Component type | Specific Component | Weight % |
|---|---|---|
| Flux (Carboxylic acid + Tertiary amine) | Oxalic acid | 0.16 |
| | N,N,N',N'tetrakis(2-hydroxyethyl) ethylenediamine | 0.84 |
| Thermosetting resin (1) | Epoxy HP-7200L (DIC Corporation) | 3.35 |
| Thermosetting resin (2) | Epoxy jER828EL (Mitsubishi Chemical Corporation) | 1.75 |
| Curing agent | Imidazole 2PHZ-PW (Shikoku Chemicals Corporation) | 0.20 |
| Polymer | Phenoxy YP-50S (Nippon Steel Chemical Corporation) | 2.7 |
| Metal filler (1) (<25 micron) | Cu (elemental) spherical | 60 |
| Metal filler (2) (<25 micron) | SnBi (80:20 wt. %) spherical | 31 |
| | Total | 100 |

The varnish mixture then underwent a second mixing using a high shear disperser to help blend the solid components with the liquid components. After the high shear dispersing mix, the varnish mixture was de-aerated. The dearated varnish mixture was then doctor-bladed onto a PET liner using a squeegee at about 50 µm thickness to create a wet film strip. The wet film strip was then dried in a convection oven at 100° C. for 10 minutes to remove the organic solvent and form a solid film strip about 35 micron thickness on the PET liner. The dried film on PET liner was then applied to the backside of a silicon wafer using a vacuum tack machine at a temperature of 100° C. The PET liner was then removed from the film strip and a layer of dicing tape was then applied directly to the film strip. The subsequent wafer-film strip-dicing tape assembly was then diced using a wafer saw. Singulated die were then removed from the dicing tape and attached to a copper leadframe using heat and pressure for a specified period of time. The film was then sintered to create the thermally and electrically conductive joint between the die and leadframe by ramping from room temperature to 200 C and then holding at 200 C for one hour. The die shear strength of the copper leadframe-film strip-silicon die assembly at 260° C. die shear temperature was 0.71 kg/mm2. The volume resistivity of the film strip was <500 µOhm-cm, and the thermal conductivity of the film strip was 25 W/mK.

Example 3. TLPS Film Containing 65% Copper/26% SnBi Alloy

A varnish was prepared by combing the following components in the amounts indicated below in Table 3 with cyclopentanone solvent in ajar and mixing by hand with a metal spatula.

TABLE 3

Compositions of 65% Copper/26% SnBi Alloy Varnish

| Component type | Specific Component | Weight % |
|---|---|---|
| Flux (Carboxylic acid + Tertiary amine) | Oxalic acid | 0.16 |
| | N,N,N',N'tetrakis(2-hydroxyethyl) ethylenediamine | 0.84 |
| Thermosetting resin (1) | Epoxy HP-7200L (DIC Corporation) | 3.35 |
| Thermosetting resin (2) | Epoxy jER828EL (Mitsubishi Chemical Corporation) | 1.75 |
| Curing agent | Imidazole 2PHZ-PW (Shikoku Chemicals Corporation) | 0.20 |
| Polymer | Phenoxy YP-50S (Nippon Steel Chemical Corporation) | 2.7 |
| Metal filler (1) (<25 micron) | Cu (elemental) spherical | 65 |
| Metal filler (2) (<25 micron) | SnBi (80:20 wt. %) spherical | 26 |
| | Total | 100 |

The varnish mixture then underwent a second mixing using a high shear disperser to help blend the solid components with the liquid components. After the high shear dispersing mix, the varnish mixture was de-aerated. The dearated varnish mixture was then doctor-bladed onto a PET liner using a squeegee at about 50 µm thickness to create a wet film strip. The wet film strip was then dried in a convection oven at 100° C. for 10 minutes to remove the organic solvent and form a solid film strip about 35 micron thickness on the PET liner. The dried film on PET liner was then applied to the backside of a silicon wafer using a vacuum tack machine at a temperature of 100° C. The PET liner was then removed from the film strip and a layer of dicing tape was then applied directly to the film strip. The subsequent wafer-film strip-dicing tape assembly was then diced using a wafer saw. Singulated die were then removed from the dicing tape and attached to a copper leadframe using heat and pressure for a specified period of time. The film was then sintered to create the thermally and electrically conductive joint between the die and leadframe by ramping from room temperature to 200 C and then holding at 200 C for one hour. The die shear strength of the copper leadframe-film strip-silicon die assembly at 260° C. die shear temperature was 0.58 kg/mm2. The volume resistivity of the film strip was <500 µOhm-cm, and the thermal conductivity of the film strip was 25 W/mK.

Example 4. Effect of Various Flux Compositions

Five samples of the varnish mixture of EXAMPLE 3 were prepared with different flux compositions substituting for the oxalic acid salt. The alternative flux compositions and the resulting volume resistivity and high temperature shear strengths of the resulting films are summarized in Table 4.

TABLE 4

Effect of Flux on Shear Strength and Volume Resistivity

| Sample Number | Acid | Amine | Shear strength at 260° C. (kg/mm2) | Volume resistivity (µΩ*cm) |
|---|---|---|---|---|
| 1 | Phthalic | Triethanolamine | 0.5-0.6 | 280 |
| 2 | Fumaric | Amino-2- propanolamine | 0.4-0.7 | 210 |
| 3 | Maleic | Diethylethanolamine | 0.49 | 310 |
| 4 | Malonic | Diethylethanolamine | 0.17 | 260 |
| 5 | Maleic | Diethanolamine | 0.49 | 310 |

These results indicate that a wide variety of carboxylic acid/alkanolamine salt flux systems are suitable for use in the invention film compositions.

Example 5. Amino Acid Fluxes

Seven varnish samples were prepared as described above, substituting amino acids for the carboxylic acid/amine salt and, in some cases omitting the catalyst/curing agent. Each of the varnishes, absent the flux and catalyst, had the composition listed below in Table 5.

TABLE 5

Base Varnish Composition

| Component type | Specific Component | Weight % |
| --- | --- | --- |
| Thermosetting resin (1) | Epoxy HP-7200L (DIC Corporation) | 2.59 |
| Thermosetting resin (2) | Epoxy ZX-1059 (Nippon Steel Chemical Corporation) | 2.59 |
| Polymer | Phenoxy YP-50S (Nippon Steel Chemical Corporation) | 3.0 |
| Metal filler (1) (<25 micron) | Cu (elemental) spherical | 65 |
| Metal filler (2) (<25 micron) | SnBi (80:20 wt. %) spherical | 26 |
| | Total | ~100 |

Films were prepared from the seven varnishes, which contained the amino acid flux and catalysts indicated below in Table 6. The resulting volume resistivity and high temperature shear strengths of the seven sample films are also summarized in Table 6:

TABLE 6

Effects of Amino Acid Fluxes/Catalyst Combinations on Shear Strength and Volume Resistivity

| Sample Number | Amino acid | Weight percent in the varnish | Catalyst | Shear strength at 260° C. (kg/mm2) | Volume resistivity (µΩ*cm) |
| --- | --- | --- | --- | --- | --- |
| 1 | Glycine | 1.6 | 2PHZ-PW | 0.32-0.43 | 99 |
| 2 | Glutamic acid | 2.33 | None | 0.21-0.35 | 253 |
| 3 | Glutamic acid | 2.0 | 2PHZ-PW | 0.4-0.48 | 202 |
| 4 | Proline | 2.0 | 2PHZ-PW | 0.27-0.51 | 505 |
| 5 | Threonine | 1.56 | 2PHZ-PW | 0.32 | 395 |
| 6 | Threonine | 2.7 | 2PHZ-PW | 0.4-0.5 | 152 |
| 7 | Threonine | 2.7 | none | 0.4-0.52 | 115 |

These data suggest that a variety of amino acids are effective as fluxes in the invention compositions and that a catalyst may not be necessary when amino acids are used as the fluxing agent. Proline and a low percentage of Threonine, however, resulted in films with high resistivity, indicative of ineffective sintering and were thus found to be unsuitable.

Example 6. Tetraethylene Glycol Flux

Three varnish samples were prepared as described above, by substituting polyols for the carboxylic acid/amine salt flux and including a variety of catalyst/curing agents. Each varnish, absent the flux and catalyst had the composition listed in Table 7.

TABLE 7

Base Varnish Composition

| Component type | Specific Component | Weight % |
| --- | --- | --- |
| Thermosetting resin (1) | Epoxy HP-7200L (DIC Corporation) | 2.59 |
| Thermosetting resin (2) | Epoxy ZX-1059 (Nippon Steel Chemical Corporation) | 2.59 |
| Polymer | Phenoxy YP-50S (Nippon Steel Chemical Corporation) | 3.0 |
| Metal filler (1) (<25 micron) | Cu (elemental) spherical | 65 |
| Metal filler (2) (<25 micron) | SnBi (80:20 wt. %) spherical | 26 |
| | Total | 100 |

The polyol fluxes, catalysts/curing agents and the resulting volume resistivity and high temperature shear strengths of the resulting films are summarized for the 7 sample in Table 8 below.

TABLE 8

Effects of Tetraethylene Glycol Flux/Catalyst Combinations on Shear Strength and Volume Resistivity

| Sample Number | Polyol | Weight percent in the varnish | Catalyst/curing agent | Shear strength at 260° C. (kg/mm2) | Volume resistivity (µΩ*cm) |
| --- | --- | --- | --- | --- | --- |
| 1 | TEG* | 1.95 | m-phthalic acid | 0.45 | 152 |
| 2 | TEG | 2.77 | threonine | 0.53 | 121 |
| 3 | TEG | 2.77 | 2PHZ-PW | 0.46 | 179 |
| 4 | TEG | 2.0 | Fumaric acid | 0.68 | 240 |

*Tetraethylene glycol

The polyol flux in conjunction with a wide variety of catalysts/curing agents provided films with excellent mechanical and electrical performance.

Example 7. Polymer Molecular Weight

An experiment was performed in which the flux, thermosetting resin, catalyst, casting solvent and reactive metal fillers were held constant and the film-forming polymer molecular weight was varied. The film forming polymers were polyamides having the Molecular Weight indicated in Table 9.

TABLE 9

Effect of Polymer Molecular Weight on TLPS Film Compositions

| Polyamide MW | TLPS reaction quality | Strength | Other observations |
| --- | --- | --- | --- |
| High >75,000 Da | None | Poor | Film remained copper color after processing |
| Low ~40,000 Da | Good | Fair | Film turned gray in processing |
| Low + Very low <10,000 Da | Good | Poor | Film turned gray during processing, but segregated into discontinuous regions |

The carboxylic acid/triethanolamine salt flux used and the polyamide, at any molecular weight, was found to have limited miscibility and absorbed too much moisture.

Substitution of a phenoxy resin at the same molecular weight range as the low molecular weight polyamide yielded a more stable mixture with less moisture absorption (not shown). Thus this molecular weight range for the film-forming polymer seems appropriate across polymer families.

Example 8. Polyol Flux

Eight varnishes were prepared with different polyol flux molecules. Each varnish sample had the base composition indicated in Table 10.

TABLE 10

Base Varnish Composition

| Component type | Specific Component | Weight % |
|---|---|---|
| Thermosetting resin (1) | Epoxy HP-7200L (DIC Corporation) | 2.59 |
| Thermosetting resin (2) | Epoxy ZX-1059 (Nippon Steel Chemical Corporation) | 2.59 |
| Polymer | Phenoxy YP-50S (Nippon Steel Chemical Corporation) | 3.0 |
| Catalyst | Imidazole | 0.2 |
| Metal filler (1) (<25 micron) | Cu (elemental) spherical | 65 |
| Metal filler (2) (<25 micron) | SnBi (80:20 wt. %) spherical | 26 |
| Total | | 100 |

The evaluation of and results of the different polyol fluxes (2.0% weight in the varnish for each) is summarized below in Table 11:

TABLE 11

Effect of Polyol Flux on TLPS Film Compositions

| Sample No. | Polyol | Shear strength at 260° C. (kg/mm2) | Volume resistivity (μΩ*cm) |
|---|---|---|---|
| 1 | 2,3,4-trihydroxybenzophenone | Not miscible with the polymer | |
| 2 | Pyrogallol | Not miscible with the polymer | |
| 3 | Trimethylolethane | 0.37 | 272 |
| 4 | Trimethylol propane | 0.15 | 875 |
| 5 | Glycerol | Not miscible with the polymer | |
| 6 | Diethylene glycol | Not miscible with the polymer | |
| 7 | Triethylene glycol | 0.32 | 345 |
| 8 | 1,2,6-hexanetriol | 0.75 | 171 |

What is claimed is:

1. A method for attaching a first adherend to a second adherend comprising the steps of:
providing a conductive film adhesive deposited on a carrier material, wherein the conductive film adhesive comprises two or more layers of conductive film adhesive laminated together to form a single film, wherein a first surface of the conductive film adhesive is exposed and wherein the conductive film adhesive comprises:
i) a polymer selected from the group consisting of phenoxies and polyamides, wherein the polymer has a weight-average molecular weight of 10,000-75,000,
ii) a flux, and
iii) a filler comprising a mixture of metallic particles wherein the mixture of particles comprises at least one reactive metallic element R1 and at least one reactive metallic element R2;
contacting the first surface of the conductive film adhesive to a surface of the first adherend;
removing the carrier material from the conductive film adhesive to expose a second surface of the conductive film adhesive;
contacting the second surface of the conductive film adhesive to a surface of the second adherend to form an assembly; and
thermally processing the assembly at a temperature T1 wherein R1 and R2 form a network comprising at least one intermetallic species disposed between the first and second adherends, wherein the first and second adherends are substantially permanently bonded together.

2. The method of claim 1, wherein the polymer has a weight-average molecular weight of 50,000-70,000.

3. The method of claim 1, wherein each of the first and the second adherends are independently selected from the group consisting of semiconductor dies, lead frames, substrates, CPUs, microprocessors, flip chips, package lids, optical components, laser diodes, multiplexers, transceivers, sensors, power supplies, high speed mass storage devices, motor controls, high voltage transformers, and automotive mechatronics.

4. The method of claim 1, wherein the first and second surfaces of the conductive film adhesive are opposed to each other.

5. The method of claim 1, wherein R1 comprises at least one reactive metallic element selected from the group consisting of copper, silver, gold, platinum, indium, aluminum, nickel and gallium.

6. The method of claim 1, wherein R2 comprises at least one reactive metallic element selected from the group consisting of Sn, Bi, Pb, Cd, Zn, Ga, In, Te, Hg, Tl, Sb, Se, and Po.

7. The method of claim 1, wherein the conductive film adhesive further comprises at least one thermosetting resin.

8. The method of claim 7, wherein said polymer comprises 10-50 weight percent of the conductive film adhesive without filler, said thermosetting resin comprises 1-10 weight percent of said conductive film adhesive, and said mixture of metallic particles comprises 75-98% by weight of said conductive film adhesive.

9. The method of claim 7, wherein the ratio of said flux to said thermosetting resin is 0.1 to 1.0 by weight.

10. The method of claim 1, wherein the conductive film adhesive further comprises at least one catalyst or curing agent.

11. The method of claim 10, wherein said catalyst or curing agent is selected from the group consisting of dicyandiamide, imidazoles, imidazole derivatives, anhydrides, carboxylic acids, amides, imides, amines, alcohols, phenols, aldehydes, ketones, nitro compounds, nitriles, carbamates, isocyanates, amino acids, peptides, thiols, sulfonamides, semicarbazones, oximes, hydrazones, cyanohydrins, ureas, phosphoric esters/acids, thiophosphoric esters/acids, phosphonic esters/acids, phosphites, phenolic novolacs, cresolic novolacs, phosphines and phosphonamides.

12. The method of claim 10, wherein said catalyst or curing agent comprises 1-50 parts per hundred parts of said thermosetting resin.

13. The method of claim 1, wherein at least a portion of the metallic particles in said mixture is protected by an organic or inorganic coating.

14. The method of claim 1, wherein said flux comprises at least one amino acid or at least one carboxylic acid having a molecular weight less than 300 Da.

15. A method for attaching a first adherend to a second adherend comprising the steps of:
- providing a conductive film adhesive deposited on a carrier material, wherein the conductive film adhesive comprises two or more layers of conductive film adhesive laminated together to form a single film, wherein a first surface of the conductive film adhesive is exposed and wherein the conductive film adhesive comprises:
- i) a polymer selected from the group consisting of phenoxies and polyamides, wherein the polymer has a weight-average molecular weight of 10,000-75,000,
- ii) a flux, and
- iii) a filler comprising a mixture of metallic particles wherein the mixture of particles comprises at least one reactive metallic element R1 and at least one reactive metallic element R2;
- contacting the first surface of the conductive film adhesive to a surface of the first adherend;
- removing the carrier material from the conductive film adhesive to expose a second surface of the conductive film adhesive;
- contacting the second surface of the conductive film adhesive to a surface of the second adherend to form an assembly; and
- thermally processing the assembly at a temperature T1 wherein R1 and R2 form a network comprising at least one intermetallic species disposed between the first and second adherends, wherein the first and second adherends are substantially permanently bonded together;
- wherein the said flux comprises at least one amino acid or at least one carboxylic acid having a molecular weight less than 300 Da, and wherein said at least one amino acid comprises at least one tertiary amine.

16. The method of claim 14, wherein said at least one carboxylic acid has at least two carboxylic acid functional groups.

17. A method for attaching a first adherend to a second adherend comprising the steps of:
- providing a conductive film adhesive deposited on a carrier material, wherein the conductive film adhesive is provided on the carrier material as a monolayer, wherein a first surface of the conductive film adhesive is exposed and wherein the conductive film adhesive comprises:
- i) a polymer selected from the group consisting of phenoxies and polyamides, wherein the polymer has a weight-average molecular weight of 10,000-75,000,
- ii) a flux, and
- iii) a filler comprising a mixture of metallic particles wherein the mixture of particles comprises at least one reactive metallic element R1 and at least one reactive metallic element R2;
- removing the carrier material from the conductive film adhesive to expose a second surface of the conductive film adhesive;
- contacting the first surface of the conductive film adhesive to a surface of the first adherend;
- contacting the second surface of the conductive film adhesive to a surface of the second adherend to form an assembly; and
- thermally processing the assembly at a temperature T1 wherein R1 and R2 form a network comprising at least one intermetallic species disposed between the first and second adherends, wherein the first and second adherends are substantially permanently bonded together.

18. The method of claim 1, wherein R1 comprises copper and R2 comprises Bi.

* * * * *